(12) United States Patent
Sogo

(10) Patent No.: US 6,410,392 B1
(45) Date of Patent: Jun. 25, 2002

(54) METHOD OF PRODUCING MOS TRANSISTOR

(75) Inventor: Yasunori Sogo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/874,111

(22) Filed: Jun. 6, 2001

(30) Foreign Application Priority Data

Jan. 29, 2001 (JP) ........................................ 2001-020518

(51) Int. Cl.[7] .................. H01L 21/336; H01L 21/3205; H01L 21/4763
(52) U.S. Cl. ..................... 438/279; 438/305; 438/592; 438/596
(58) Field of Search ................ 438/585–597, 438/279, 305

(56) References Cited

U.S. PATENT DOCUMENTS

| | | | | |
|---|---|---|---|---|
| 5,920,783 A | * | 7/1999 | Tseng et al. ................. | 438/305 |
| 6,077,763 A | * | 6/2000 | Chen et al. ................. | 438/595 |
| 6,180,477 B1 | * | 1/2001 | Liao ............................ | 438/305 |
| 6,274,446 B1 | * | 8/2001 | Agnello et al. ............. | 438/304 |
| 6,335,248 B1 | * | 1/2002 | Mandelman et al. ....... | 438/279 |
| 2001/0010962 A1 | * | 8/2001 | Chen et al. ................. | 438/305 |

FOREIGN PATENT DOCUMENTS

| | | | |
|---|---|---|---|
| JP | A 8-64691 | 3/1996 | |
| JP | A 11-74270 | 3/1999 | |

* cited by examiner

*Primary Examiner*—Richard Booth
(74) *Attorney, Agent, or Firm*—Burns, Doane, Swecker & Mathis, LLP

(57) ABSTRACT

The surface of a silicon substrate is sputter-etched so that silicon clusters sputtered out form a silicon film on a side wall spacer. Then, a metal film of cobalt, titanium or the like is built up on the entire surface. Thereafter, silicidizing process is carried out to form metal silicide layers on a diffusion layer and the side wall spacer. Then, an inter-layer insulation film 14 is formed and is photo-etched to provide the inter-layer insulation film with a contact hole 15 overlapping the side wall spacer.

4 Claims, 6 Drawing Sheets

METHOD OF PRODUCING MOS TRANSISTOR

BACKGROUND OF THE INVENTION

1. Field of the Invention

The present invention relates to a method of producing a MOS transistor having a salicide (self-aligned silicide) structure.

2. Description of the Related Art

FIGS. 5(a)–5(b) and FIGS. 6(a)–6(c) are sectional views showing a conventional method of producing a MOS transistor having a salicide structure, in the order of steps.

In the case of producing a MOS transistor having a salicide structure by a conventional method, first, a gate oxide film 3 is formed on an active region (-the region free of field oxide film) of a silicon substrate 2 on which a field oxide film 1 has been formed. Then, a gate electrode 7 having a two-layer structure consisting of a polysilicon film 5 and a metal silicide film 6 with a silicon oxide film 4 on top thereof is formed on the gate oxide film 3 (FIG. 5(a)).

Thereafter, a silicon nitride film is built up on the entire surface, and is subjected to anisotropic etching to form a side wall spacer 8 on side walls of the gate electrode 7 (FIG. 5(b)). In this case, those portions of the gate oxide film 3 which are not covered by the gate electrode 7 or the side wall spacer 8 are also etched away, leaving the gate oxide film 9 beneath the gate electrode 7 and the side wall spacer 8.

Thereafter, a diffusion layer 10 is formed in the surface layer of the silicon substrate 2 (FIG. 5(c)).

Then, a metal film consisting of cobalt, titanium or the like is built up on the entire surface, and silicidizing process is carried out to form a metal silicide layer 12 consisting of cobalt silicide (CoSi2), titanium silicide (TiSi2) or the like on the diffusion layer 10 (FIG. 6(a)).

Thereafter, an inter-layer insulation film 14 is formed, and a contact hole 15 overlapping the side wall spacer 8 is formed in the inter-layer insulation film 14 (FIG. 6(b)).

Then, a barrier metal film 16 and a metallic plug 17 are formed in the contact hole 15. Thereafter a metallic wiring 18 is formed on the inter-layer insulation film 14 (FIG. 6(c)).

In this-manner, a MOS transistor having a salicide structure is produced.

While the method of producing a MOS transistor according to the prior art comprises the above-mentioned steps and the metal silicide layer 12 is formed on the diffusion layer 10 to thereby reduce the resistance of the diffusion layer 10, there is the problem that the resistance of the diffusion layer 10 increases where the width W of the diffusion layer 10 is reduced to or below 0.35 m.

In addition, since the contact hole 15 is formed so as to overlap the side wall spacer 8 by a self-alignment process, the area of contact with the diffusion layer 10 is reduced by the amount of overlap between the contact hole 15 and the side wall spacer 8 and, therefore, there is the problem that the contact resistance is increased.

SUMMARY OF THE INVENTION

Accordingly, it is an object of the present invention to provide a method of producing a MOS transistor having a salicide structure in which the resistance of a diffusion layer and contact resistance are low.

A method of producing MOS transistor according to the present invention comprises the steps of: forming a gate electrode on a gate oxide film formed on a silicon substrate, forming a side wall spacer on a side wall of the gate electrode after the formation of the gate electrode, forming a diffusion layer in a surface layer of the silicon substrate after the formation of the side wall spacer, forming a silicon film on the side wall spacer after the formation of the diffusion layer, building up a metal film after the formation of the silicon film and performing a heat treatment to form a metal silicide layer on the diffusion layer and the side wall spacer, and forming an inter-layer insulation film after the formation of the metal silicide layer and providing the inter-layer insulation film with a contact hole overlapping the side wall spacer.

A method of producing MOS transistor according to the present invention is characterized in that the step of forming the silicon film on the side wall spacer comprises a step of sputter etching the exposed surface of the silicon substrate.

A method of producing MOS transistor according to the present invention is characterized in that the amount of etching of the surface of the silicon substrate is not less than 100 Å.

A method of producing MOS transistor according to the present invention is characterized in that the step of forming the silicon film on the side wall spacer comprises the steps of building up a silicon film covering the gate electrode and the side wall spacer, and subjecting the silicon film to anisotropic etching after the building up of the silicon film.

BRIEF DESCRIPTION OF THE DRAWINGS

Other objects and further features of the present invention will be apparent from the following detailed description when read in conjunction with the accompanying drawings, in which.

DETAILED DESCRIPTION OF THE PREFERRED EMBODIMENTS

Embodiment 1

Figure 1A:
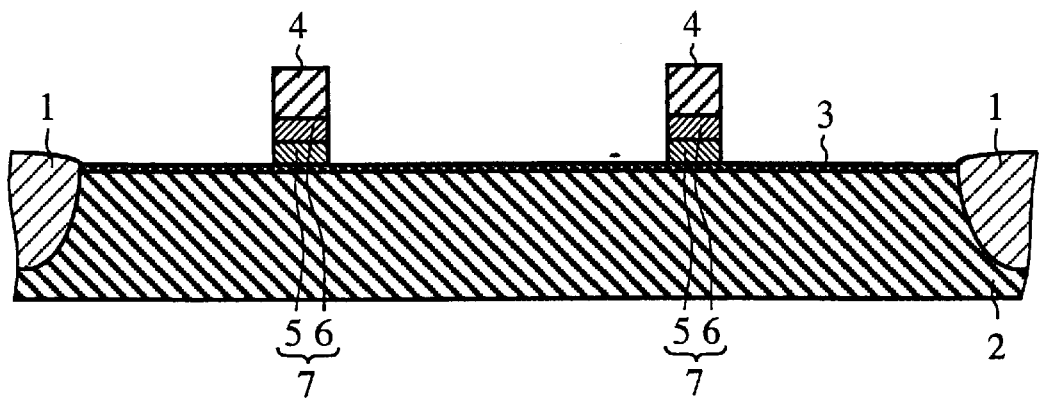
FIGS. 1(a)–1(c) are sectional views showing a method of producing a MOS transistor according to Embodiment 1 of the present invention, in the order of steps (No. 1).
Figure 1B:
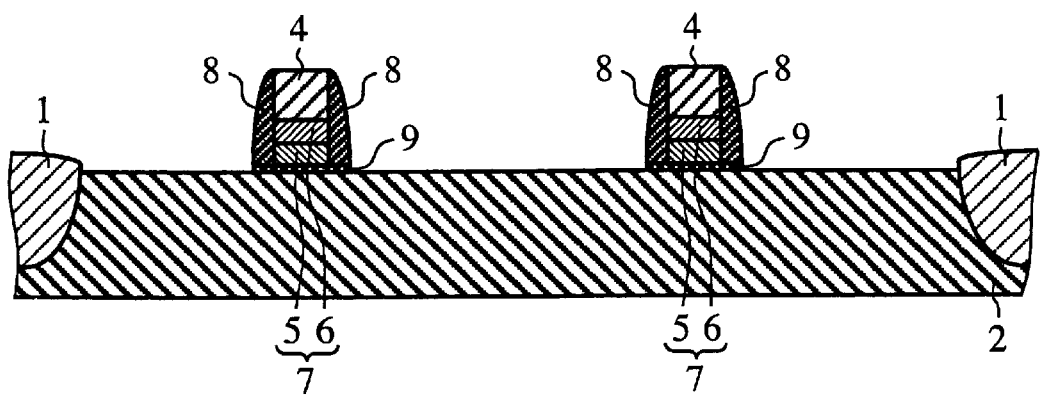

FIGS. 1(a)–(c), FIGS. 2(a)–2(c) and FIG. 3 are sectional views showing, in the order of steps, a method of producing a MOS transistor having a salicide structure according to Embodiment 1 of the invention.

In the case of producing a MOS transistor having a salicide structure by the method of Embodiment 1, first, a gate oxide film 3 is formed on active regions (other regions than a field oxide film 1) of a silicon substrate 2 on which the field oxide film 1 has been formed. Then, a polysilicon film is built up on the entire surface by an LPCVD process, a metal silicide film is built up thereon by a sputtering process, and a silicon oxide film formed using TEOS (tetraethyl orthosilicate) as a raw material is built up thereon by an LPCVD process. Thereafter, the silicon oxide film, the metal silicide film and the polysilicon film are photo-etched, whereby a gate electrode 7 of a two-layer structure consisting of the polysilicon film 5 and the metal silicide film 6 with the silicon oxide film 4 on top thereof is formed on the gate oxide film 3 (FIG. 1(a)). The silicon oxide film 4 is provided on top of the gate electrode 7 to prevent connection between the gate electrode and a metallic plug in a contact hole formed in an inter-layer insulation film described later.

Thereafter, a silicon nitride film is built up on the entire surface by an LPCVD process. The silicon nitride film is then subjected to anisotropic etching to form a side wall spacer 8 on side walls of the gate electrode 7 (FIG. 1(b)). In this case, those portions of the gate oxide film 3 which are not covered by the gate electrode 7 or the side wall spacer 8 are also etched away, leaving the gate oxide film 9 beneath the gate electrode 7 and the side wall spacer 8.

Figure 1C:
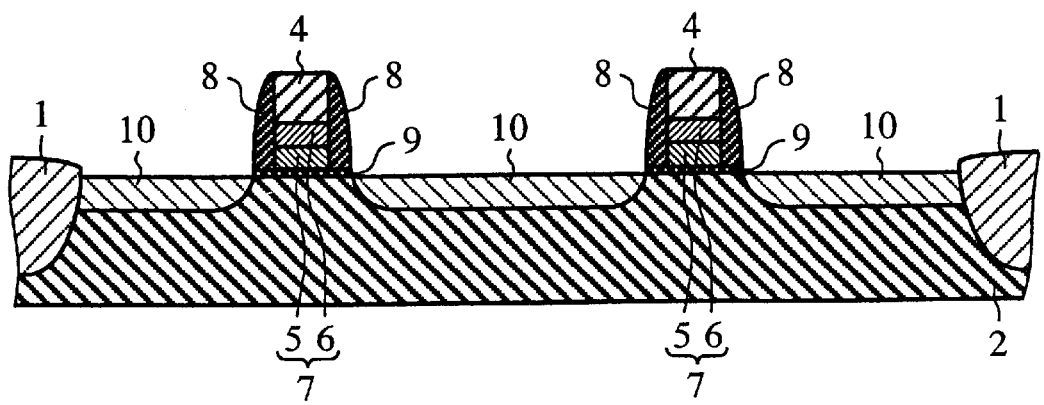
Figure 2A:
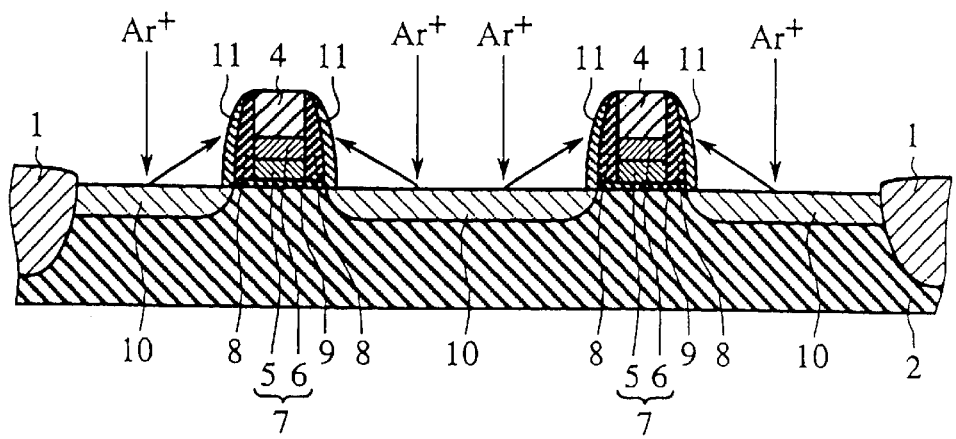
FIGS. 2(a)–2(c) are sectional views showing the method of producing a MOS transistor according to Embodiment 1 of the invention, in the order of steps (No. 2).
Figure 2B:
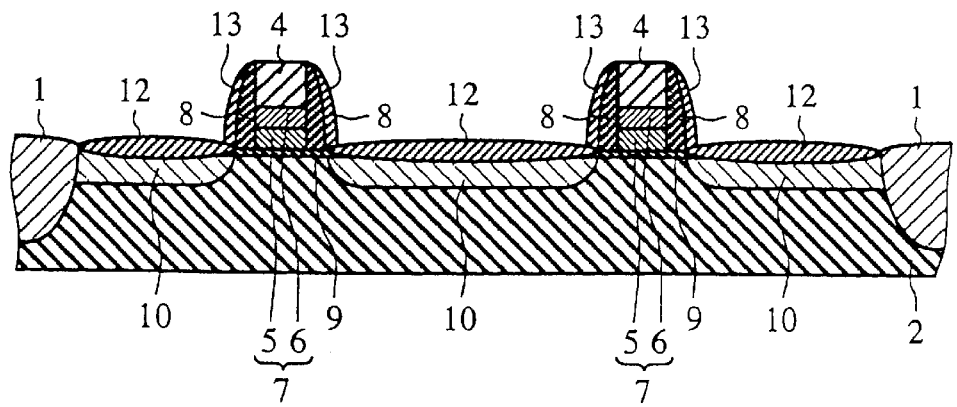
Figure 2C:
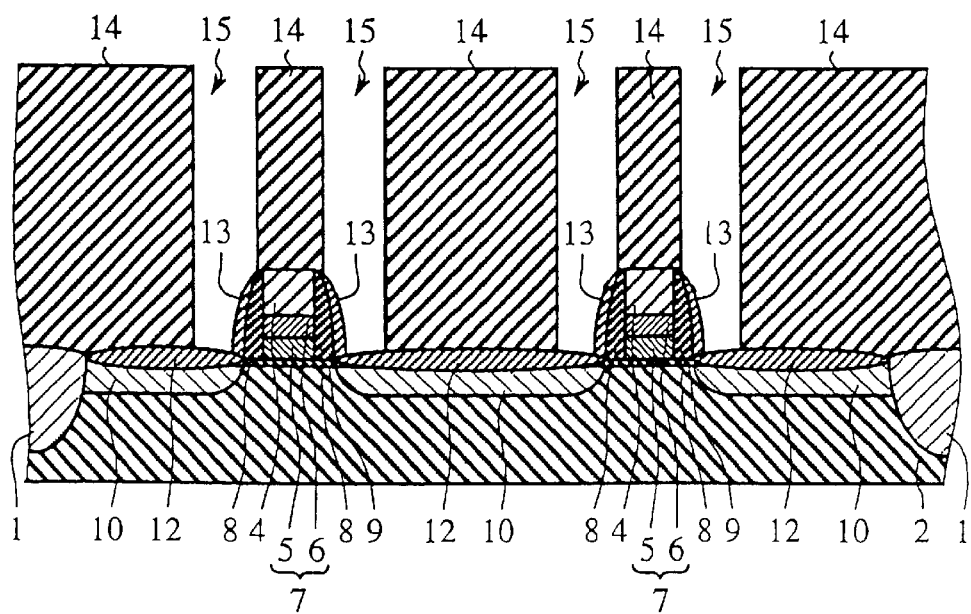

Thereafter, an n-type (or p-type) impurity is ion injected into the silicon substrate 2 using the gate electrode 71 the side wall spacer 8 and the field oxide film 1 as a mask, whereby a diffusion layer 10 is formed in the surface layer of the silicon substrate 2 (FIG. 1(c)).

Thereafter, the exposed surface of the silicon substrate 2 (namely, the diffusion layer 10) is subjected to sputter etching. In this case, accelerated argon ions and the like perpendicularly collide against the surface of the silicon substrate 2, and silicon clusters sputtered out pile up on the side wall spacer 8, whereby a silicon film 11 is formed on the side wall spacer 8 (FIG. 2(a)). The amount of pile-up of the silicon cluster, or the film thickness of the silicon film 11, depends on the amount of etching of the surface of the silicon substrate 2. Preferably, the surface of the silicon substrate 2 is etched by not less than 100 Å. By etching the surface by not less than 100 Å, the silicon film 11 can be formed uniformly on the side wall spacer 8, and a metal silicide layer described later can be formed uniformly. It is difficult for the silicon clusters sputtered out to pile up on the silicon oxide film 4 formed on top of the gate electrode 7.

Thereafter, a metal film consisting of cobalt, titanium or the like is built up on the entire surface by a sputtering process. Then, a silicidizing process is carried out, whereby metal silicide layers 12, 13 consisting of cobalt silicide (CoSi2), titanium silicide (TiSi2) or the like are formed on the diffusion layer 10 and the side wall spacer 8 (FIG. 2(b)). In the silicidizing process, first, a heat treatment at a low temperature is carried out by a lamp anneal process to silicidize the metal film built up on the diffusion layer 10 and the side wall spacer 8. Next, the unreacted metal film is etched away. Then, a heat treatment at a high temperature is carried out by a lamp anneal process, whereby the silicidized metal film is converted into disilicide.

Thereafter, an inter-layer insulation film 14 is formed by a normal pressure CVD process. Then, the inter-layer insulation film 14 is photo-etched, whereby a contact hole 15 overlapping the side wall spacer 8 is formed in the inter-layer insulation film 14 (FIG. 2(c)). In this case, the position on the side of the gate electrode 7 of contact with the diffusion layer 10 is determined in a self-matching manner by the side wall spacer 8.

Figure 3:
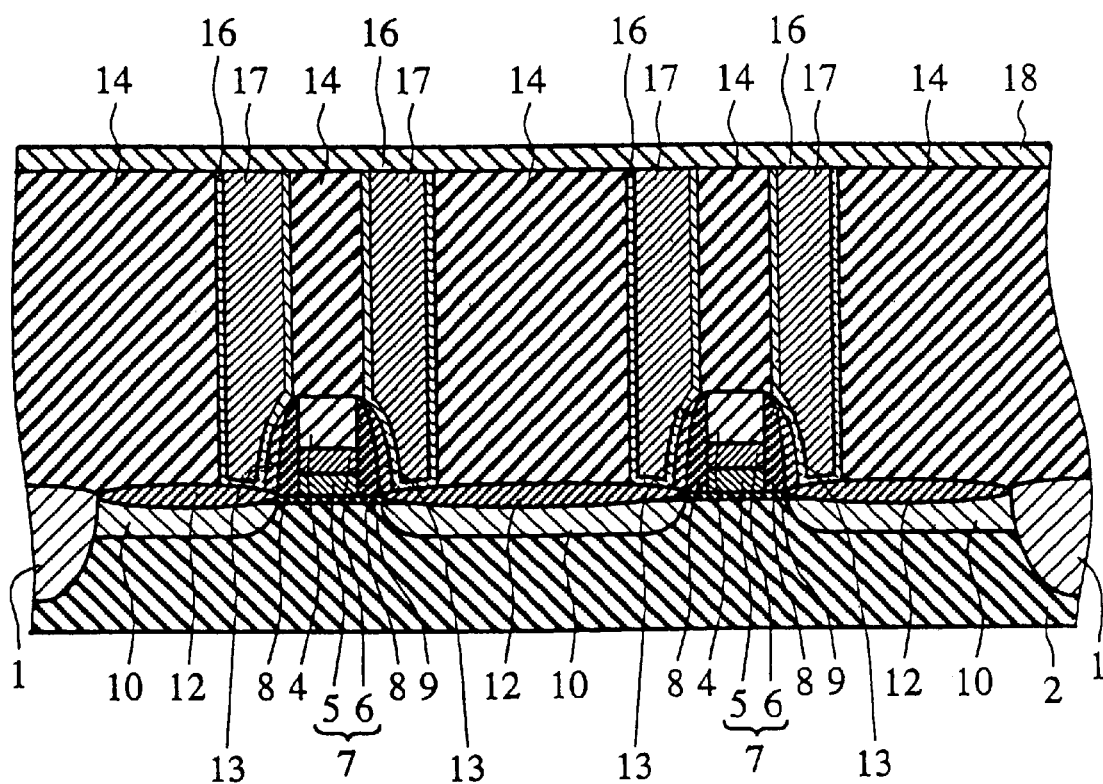
FIG. 3 is a sectional view showing the method of producing a MOS transistor according to Embodiment 1 of the invention, in the order of steps (No. 3).

Thereafter, a titanium compound such as titanium nitride (TiN) is built up on the entire surface by a reactive sputtering process. Then, a barrier metal film 16 consisting of titanium nitride (TiN) or the like is formed on the inside wall of the contact hole 15 and those portions of the metal silicide layers 12, 13 on the diffusion layer 10 and the side wall spacer 8 which are exposed from the contact hole 15. Subsequently, a metal film consisting of tungsten or the like is built up on the entire surface by a CVD process. Then, the metal film is etched back to form a metallic plug 17 consisting of tungsten or the like embedded in the contact hole 15 covered with the barrier metal film 16. Thereafter, a metal film consisting of an aluminum alloy or the like is built up on the entire surface by a sputtering process. Then, the metal film is photo-etched to form a metal wiring 18 consisting of an aluminum alloy or the like on the inter-layer insulation film 14 (FIG. 3).

In this manner, a MOS transistor having a salicide structure is produced.

As described above, according to Embodiment 1, the metal silicide layer 13 is provided also on the side wall spacer 8 and, therefore, increase of resistance of the diffusion layer 10 can be restrained even when the width of the diffusion layer 10 is reduced. In addition, increase of contact resistance can be restrained even if the contact hole 15 overlaps the side wall spacer 8.

In addition, according to Embodiment 1, the silicon film 11 is formed on the side wall spacer 8 by sputter etching of the exposed surface of the silicon substrate 2 (namely, the diffusion layer 10), and, therefore, the thickness of the silicon film 11 on the side wall spacer 8 can be controlled by the amount of etching of the surface of the silicon substrate 2.

Embodiment 2

Figure 4A:
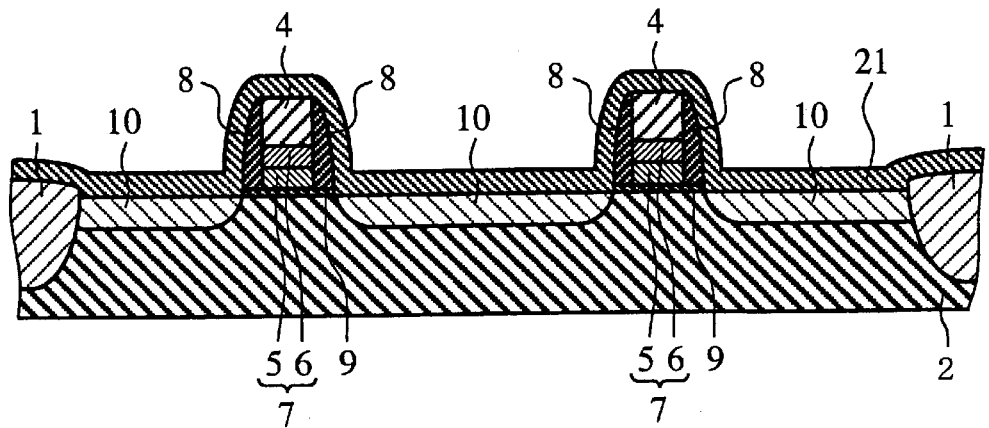
FIGS. 4(a)–4(c) are sectional views showing a method of producing a MOS transistor according to Embodiment 2 of the present invention, in the order of steps.
Figure 4B:
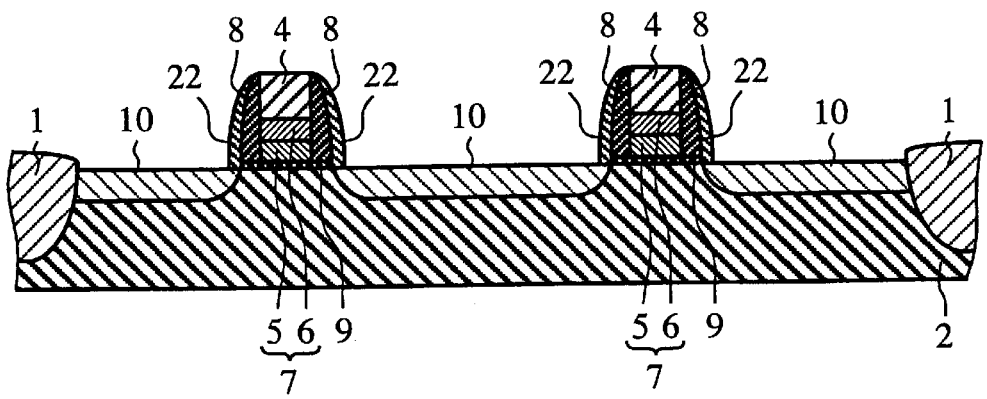
Figure 4C:
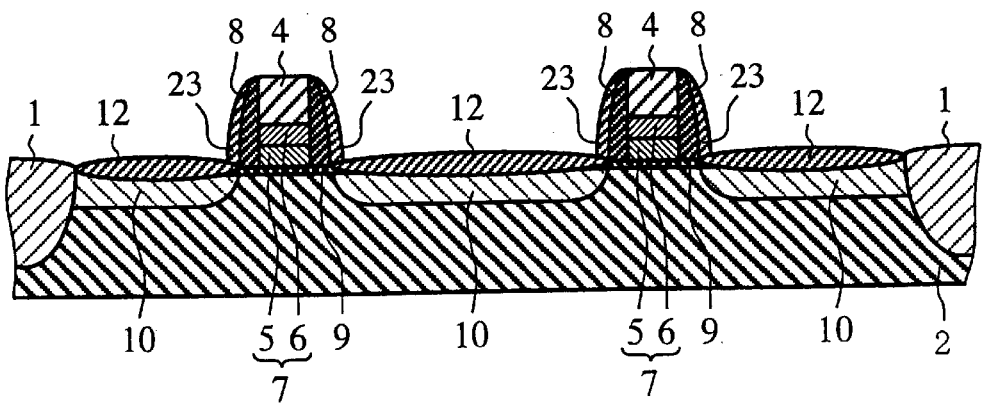
Figure 5A:
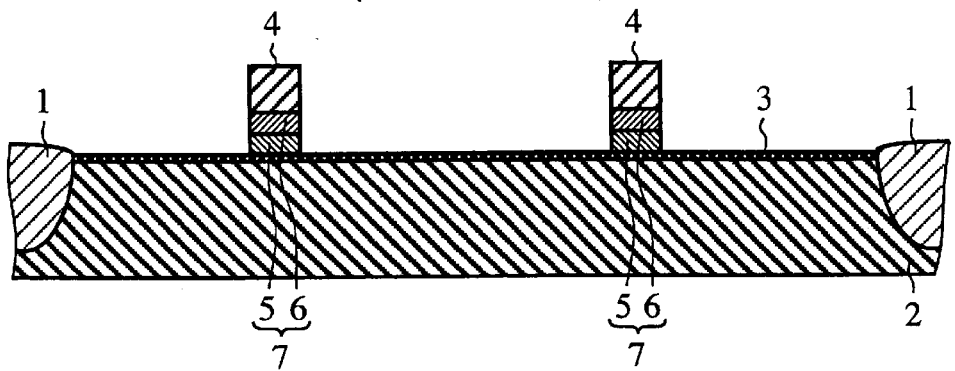
FIGS. 5(a)–5(c) are sectional views showing a method of producing a MOS transistor according to the prior art, in the order of steps (No. 1).
Figure 5B:
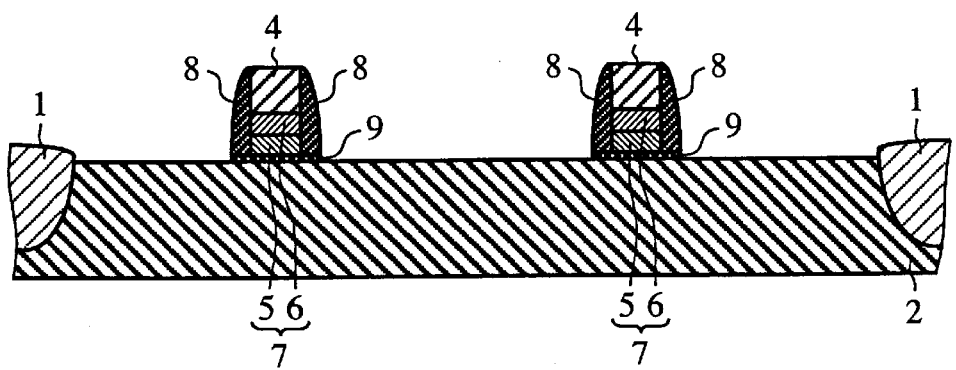
Figure 5C:
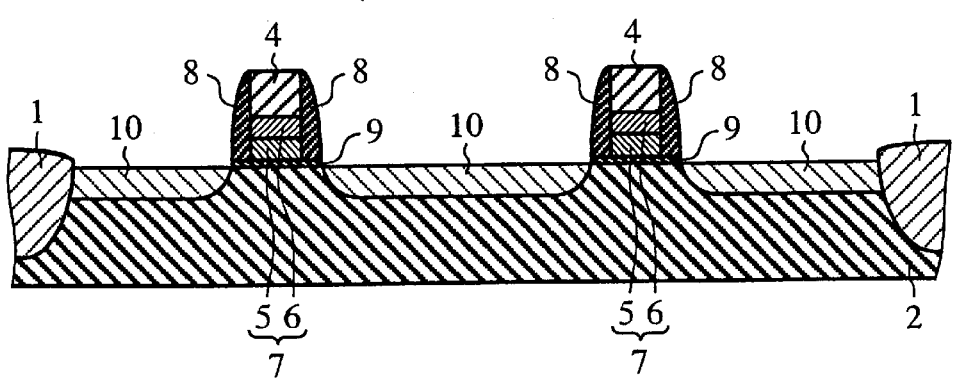
Figure 6A:
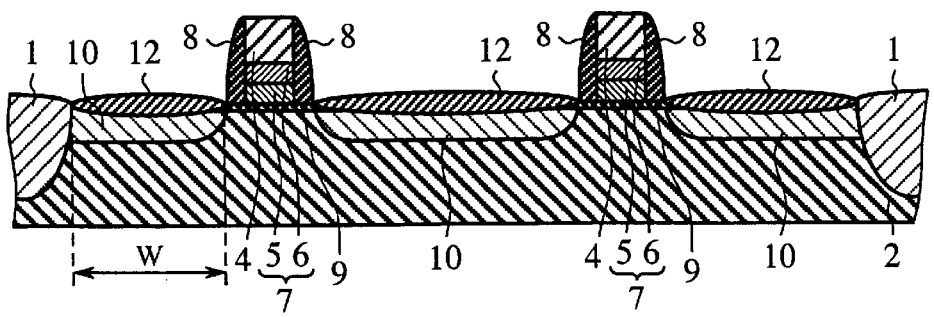
FIGS. 6(a)–6(c) are sectional views showing the method of producing a MOS-transistor according to the prior art, in the order of steps (No. 2).
Figure 6B:
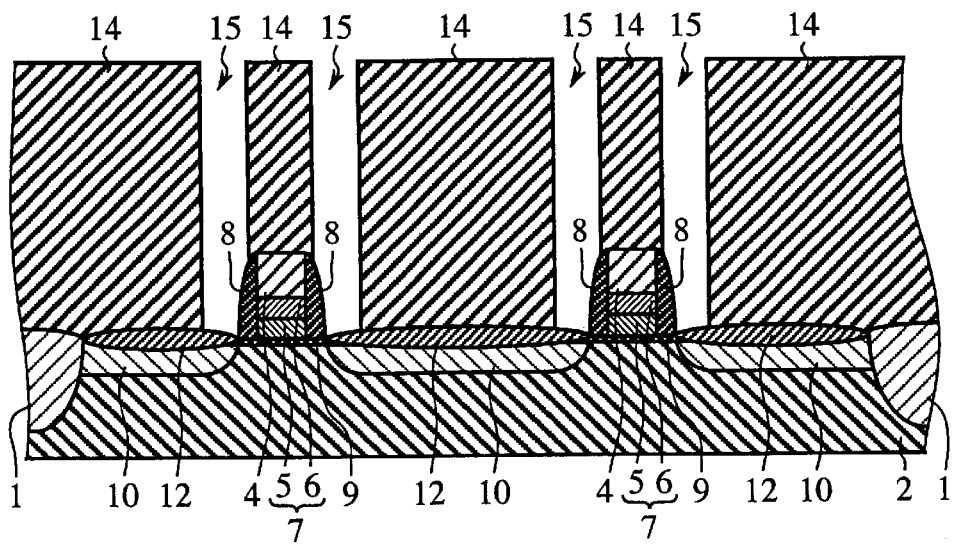
Figure 6C:
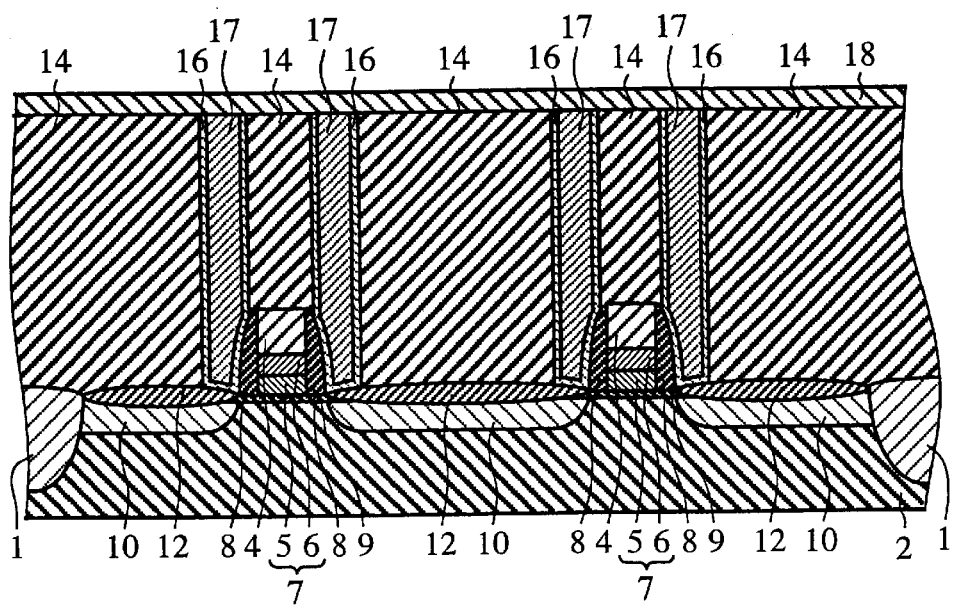

FIGS. 4(a)–4(c) are sectional views showing, in-the order of steps, a method of producing a MOS transistor having a salicide structure according to Embodiment 2 of this invention.

In the case of producing a MOS transistor having a salicide structure by the method according to Embodiment 2, the process up to the step of forming the diffusion layer 10 in the surface layer of the silicon substrate 2 is the same as in Embodiment 1.

Thereafter, in the method of Embodiment 2, a silicon film 21 consisting of polysilicon, doped polysilicon, amorphous silicon, doped amorphous silicon or the like is built up on the entire surface by an LPCVD process (FIG. 4(a)).

Then, the silicon film 21 is subjected to anisotropic etching, whereby a silicon film 22 is left on the side wall spacer 8 (FIG. 4(b)).

Thereafter, in the same manner as in Embodiment 1, a silicidizing process is carried out to form metal silicide layers 12, 23 consisting of cobalt silicide (CoSi2), titanium silicide (TiSi2) or the like on the diffusion layer 10 and the side wall spacer 8 (FIG. 4(c)). The process of Embodiment 2 after this step is the same as in Embodiment 1.

In this manner, a MOS transistor having a salicide structure is produced.

As described above, according to Embodiment 2, the metal silicide layer 23 is formed also on the side wall spacer 8 and, therefore, increases in the resistance of the diffusion layer and in contact resistance can be restrained, in the same manner as in Embodiment 1.

In addition, according to Embodiment 2, the silicon film 22 is formed on the side wall spacer 8 by building up the silicon film 21 on the entire surface and subjecting it to anisotropic etching, and, accordingly, the thickness of the silicon film 22 on the side wall spacer 8 is determined solely by the shape of the side wall spacer 8.

While the case of using the gate electrode 7 having a two-layer structure consisting of the polysilicon film 5 and the metal silicide film 6 has been described in the above embodiments, a gate electrode consisting of doped polysilicon may also be used.

As has been described above, according to the invention, a method of producing a MOS transistor comprises the steps of: forming a gate electrode on a gate oxide film formed on a silicon substrate, forming a side wall spacer on a side wall of the gate electrode after the formation of the gate electrode, forming a diffusion layer in the surface layer of the silicon substrate after the formation of the side wall spacer, forming a silicon film on the side wall spacer after the formation of the diffusion layer, building up a metal film after the formation of the silicon film and performing a heat treatment to form a metal silicide layer on the diffusion layer and the side wall spacer, and forming an inter-layer insulation film after the formation of the metal silicide layer and providing the inter-layer insulation film with a contact hole overlapping the side wall spacer. By this arrangement, there can be obtained a method of producing a MOS transistor capable of producing such a MOS transistor that the resistance of the diffusion layer is low even when the width of the diffusion layer is reduced and that contact resistance is low even where the contact hole overlaps the side wall spacer.

According to the invention, a method of producing a MOS transistor is so arranged that the step of forming a silicon film on a side wall spacer comprises a step of sputter-etching the exposed surface of a silicon substrate. By this arrangement, there can be obtained a method of producing a MOS transistor in which the thickness of the silicon film on the side wall spacer can-be controlled by the amount of etching of the surface of the silicon substrate.

According to the invention, a method of producing a MOS transistor is so arranged that the amount of etching of the surface of the silicon substrate is-not less than 100 Å. By this arrangement, there can be obtained a method of producing a MOS transistor in which a silicon film can be formed evenly on a side wall spacer.

According to the invention, a method of producing a MOS transistor is so arranged that the step of forming a silicon film on a side wall spacer comprises the steps of building up a silicon film covering a gate electrode and the side wall spacer, and subjecting the silicon film to anisotropic etching after the building up of the silicon film. By this arrangement, there can be obtained a method of producing a MOS transistor in which the thickness of the silicon film on the side wall spacer is determined evenly by the shape of the side wall spacer.

The present invention is not limited to the above-described embodiments, and variations and modifications may be made without departing from the scope of the present invention.

What is claimed is:

1. A method of producing MOS transistor comprising the steps of:

forming a gate electrode on a gate oxide film formed on a silicon substrate, forming a side wall spacer on a side wall of said gate electrode after the formation of said gate electrode, forming a diffusion layer in a surface layer of said silicon substrate after the formation of said side wall spacer, forming a silicon film on said side wall spacer after the formation of said diffusion layer, building up a metal film after the formation of said silicon film and performing a heat treatment to form a metal silicide layer on said diffusion layer and said side wall spacer, and forming an inter-layer insulation film after the formation of said metal silicide layer and providing said inter-layer insulation film with a contact hole overlapping said side wall spacer.

2. The method of producing MOS transistor according to claim 1, wherein the step of forming said silicon film on said side wall spacer comprises a step of sputter etching an exposed surface of said silicon substrate.

3. The method of producing MOS transistor according to claim 1, wherein the amount of etching of the surface of said silicon substrate is not less than 100 Å.

4. The method of producing MOS transistor according to claim 1, wherein the step of forming said silicon film on said side wall spacer comprises the steps of building up a silicon film covering said gate electrode and said side wall spacer, and subjecting said silicon film to anisotropic etching after the building up of said silicon film.

* * * * *